United States Patent
Honda et al.

(10) Patent No.: US 6,944,060 B2
(45) Date of Patent: Sep. 13, 2005

(54) NON-VOLATILE STORAGE DEVICE AND CONTROL METHOD THEREOF

(75) Inventors: Toshiyuki Honda, Kyotanabe (JP); Keisuke Sakai, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/493,383

(22) PCT Filed: Feb. 7, 2003

(86) PCT No.: PCT/JP03/01289

§ 371 (c)(1),
(2), (4) Date: Apr. 23, 2004

(87) PCT Pub. No.: WO03/067605

PCT Pub. Date: Aug. 14, 2003

(65) Prior Publication Data

US 2004/0246779 A1 Dec. 9, 2004

(30) Foreign Application Priority Data

Feb. 8, 2002 (JP) ...................................... 2002-032081

(51) Int. Cl.[7] .............................................. G11C 16/04
(52) U.S. Cl. .............................. 365/185.29; 365/185.11
(58) Field of Search ....................... 365/185.29, 185.11, 365/185.33, 230.03

(56) References Cited

U.S. PATENT DOCUMENTS

| 5,572,466 | A  | * | 11/1996 | Sukegawa | 365/185.33 |
| 6,078,520 | A  | * | 6/2000  | Tobita et al. | 365/185.09 |
| 6,388,908 | B1 | * | 5/2002  | Araki et al. | 365/45 |
| 6,678,203 | B1 | * | 1/2004  | Yokota et al. | 365/230.03 |

FOREIGN PATENT DOCUMENTS

| JP | 7-153284 | 6/1995 |
| JP | 7-219720 | 8/1995 |
| JP | 11-3270 | 1/1999 |
| JP | 11-3287 | 1/1999 |
| JP | 11-191297 | 7/1999 |
| JP | 2000-20252 | 1/2000 |

* cited by examiner

Primary Examiner—Anh Phung
(74) Attorney, Agent, or Firm—Wenderoth, Lind & Ponack, L.L.P.

(57) ABSTRACT

A memory card (100) is comprised of: a flash memory (120) that includes a plurality of physical blocks (122) made up of a plurality of pages for storing data and a page register (121) that holds data to be written to a page; and a controller (110) that specifies and erases an invalid physical block with reference to a valid block table (114) indicating whether valid data is stored in each of the physical blocks (122), when data is written, and that transfers, at the same time, the data to be written to the page register (121) while carrying out said erasure.

11 Claims, 13 Drawing Sheets

NON-VOLATILE STORAGE DEVICE AND CONTROL METHOD THEREOF

TECHNICAL FIELD

The present invention relates to a nonvolatile storage device utilizing a semiconductor memory, and a control method thereof.

BACKGROUND ART

A storage device that has recently come to be used as a storage of a portable device handling audio data and video data, is equipped with a nonvolatile memory such as a flash memory that is updatable, highly portable, and does not require battery backup, and the like.

FIG. 1 is a block diagram showing the structure of a memory card that is an existing nonvolatile storage device.

A memory card 300, which is a device for storing data, being connected to a host apparatus 200 such as a personal computer and a digital camera, includes a controller 310 and a flash memory 320. The host apparatus 200 writes and reads data to and from the memory card 300, by use of a card control signal and a card data signal. Such card control signal and card data signal are inputted/outputted between the host apparatus 200 and the controller 310 inside the memory card 300.

Regarding data writing and reading performed between the controller 310 and the flash memory 320, the controller 310 writes and reads data to and from the flash memory 320 by use of the memory control signal and memory data signal. Note that the flash memory 320 connected to the controller 310 does not have to be one chip, and therefore that plural chips may be connected to the controller 310.

FIG. 2 is a block diagram showing the configuration of the controller 310.

The controller 310 is comprised of an MPU 311, a page RAM 312, an address conversion table 313, and an erase block table 314.

The MPU 311 has an overall control over the controller 310, as well as controlling the data erasure from, data writing to, and data reading from the flash memory 320. The page RAM 312 is a volatile memory for temporarily storing data handled between the host apparatus 200 and the flash memory 320. The address conversion table 313 is a table for making a conversion between a host apparatus 200-specified address of data that is written to the flash memory 320 and a physical address in the flash memory 320. The erase block table 314 is a table that indicates, on a physical address basis, whether physical blocks in the flash memory 320 have already been erased or written. Information stored in the address conversion table 313 and the erase block table 314 is generated by reading out data of all the physical blocks in the flash memory 320 at the power-on time.

FIG. 3 is a block diagram showing the configuration of the flash memory 320.

The flash memory 320 is comprised of a page register 321, a memory cell array 323, a row decoder 324, and a command decoder 325.

The memory cell array 323 is made up of all the memory cells contained in one chip of the flash memory 320. Memory cells constitute a page in units in which reading and writing can be performed simultaneously. Furthermore, a plurality of pages make up a physical block 322 that is an erasure unit. The page register 321 has the capacity equivalent to pages of memory cells, and holds write data to be inputted from the controller 310 and read data to be read out from memory cells. The row decoder 324 selects a page specified by the controller 310 at the time of data reading and writing, whereas it selects a physical block 322 specified by the controller 310 at the time of erasing data. The command decoder 325 executes a command from the controller 310 that is sent as a memory control signal.

FIG. 4 is a schematic diagram showing example correspondence among data elements stored in the address conversion table 313, the erase block table 314, and the flash memory 320.

Data in address 0 described in the address conversion table 313 is a physical address that corresponds to logical address 0. Since such data is "0001" in an example illustrated in FIG. 4(*a*), it indicates that data in logical address 0 is written in physical address 1 in the flash memory 320. Meanwhile, "FFFF" indicating a physical address that corresponds to logical address 1 is an invalid value that means that there is no data in logical address 1. Here, "invalid value" is an arbitrary value that indicates invalidity and that is defined as invalid under the address conversion rule. An example of such value is a fixed value "0" and the maximum value "65535" in the case of 16-bit data. Furthermore, since data in address 2 in the address conversion table 313 is "0002", it indicates that data in logical address 2 is written in physical address 2 in the flash memory 320.

Meanwhile, the erase block table 314 shows the state of the respective physical blocks in the flash memory 320. The erase block table 314 holds, as address values, values that correspond to the respective physical addresses in the flash memory 320, and holds, as data values, whether the respective physical blocks in the flash memory 320 have already been erased or written. For example, the erase block table 314 holds the value 1 when a physical block has already been erased, whereas it holds the value 0 when a physical block has already been written. Stated another way, data in address 0 in the erase block table 314 indicates whether a physical block corresponding to physical address 0 in the flash memory 320 has already been erased/written. Since such data is "1" in an example illustrated in FIG. 4(*a*), it indicates that the physical block corresponding to physical address 0 has already been erased. Similarly, since each data in addresses 1 and 2 in the erase block table 314 is "0", it indicates that the physical blocks corresponding to the respective physical addresses 1 and 2 in the flash memory 320 have already been written.

Next, a description is given of the operation to be performed when data in the existing memory card 300 with the above structure is updated by the host apparatus 200. FIG. 5 is a timing chart showing a write operation to be performed in such case, whereas FIG. 6 Is a timing chart showing an erase operation to be performed in such case. In the respective timing charts shown in FIGS. 5 and 6, upper signals are the card control signal and card data signal shown in FIG. 1, indicating that data is inputted from the host apparatus 200 to the memory card 300. Middle signals are the memory control signal and memory data signal shown in FIG. 3, indicating that data is inputted from the controller 310 to the flash memory 320. A lower signal is a memory control signal, indicating that data is outputted from the flash memory 320 to the controller 310. Here, a description is given for the case as an example where data in logical address 0 in the memory card 300 is updated, in the state shown in FIG. 4(*a*).

First, the host apparatus 200 sends, to the memory card 300, a write command 401 for logical address 0 as the card control signal at time t421, and starts transferring the write data as the card data signal at time t422. Such write data is to be stored into the page RAM 312 of the controller 310 in the memory card 300.

Upon receipt of the write command 401 from the host apparatus 200, the controller 310 searches the erase block table 314 for an already erased physical block 322 to which it is possible to write the data. The controller 310 detects from the erase block table 314 that a physical block in physical address 0 is an already erased physical block 322.

After the data transfer from the host apparatus 200 is finished, the controller 310 sends a write address specification command 403 for this data at time t423, so as to indicate the flash memory 320 that the write address is to be inputted thereafter. The command decoder 325 decodes the write address specification command 403, and controls the row decoder 324 to make it obtain the address to be inputted thereafter.

The controller 310 sends a write address 404 to the flash memory 320 at time t424. The row decoder 324 obtains the inputted write address, and selects a specified page so that the data can be written to it. Next, the command decoder 325 recognizes that the write address has been obtained, and controls the page register 321 to obtain the write address to be inputted thereafter.

Next, the controller 310 starts transferring the write data 405 from the page RAM 312 to the flash memory 320 at time t425. The command decoder 325 stores the inputted write data into the page register 321.

Then, the controller 310 sends a write execute command 406 to the flash memory 320 at time t427.

In response to this, the command decoder 325 starts, at time t427, writing the data stored in the page register 321 to memory cells of a page selected by the row decoder 324. At the same time, the command decoder 325 sends, to the controller 310, a write busy 407 as the memory control signal indicating that writing is ongoing. A period defined as the write busy 407 indicates that no data shall be allowed to be newly read out, written, or erased during such period. This is because the command decoder 325 does not allow any commands to be inputted from the controller 310 for the reason that the same page that is subject to writing needs to remain selected by the row decoder 324 while such writing is taking place.

According to a general specification, "erase" and "write" operations to be performed on the flash memory 320 complete separately and therefore no command is to be written while writing and erasure are in busy state (e.g. NH29W12811T datasheet of Hitachi Ltd.)

Next, after the write operation to the page is finished at time t428, the command decoder 325 releases the write busy 407 of the memory control signal. From then on, it is possible for commands to be inputted from the controller 310.

After this, the controller 310 writes, to the other pages of the physical block 322 to which the above writing has been performed, data transferred from the host apparatus 200 in the above-described manner.

After the data writing is finished as in the above manner, the controller 310 obtains, from the address conversion table 313, a physical block in which the data in logical address 0 subject to the writing, was originally written. Since data in address 0 in the address conversion table 313 is "0001" in an example shown in FIG. 4(a), the physical block corresponding to physical address 1 is the location where the old data was written.

Then, in order to erase the old data which became invalid due to the writing performed this time, the controller 310, as shown in FIG. 6, sends an erase address specification command 411 for the physical block 322 corresponding to physical address 1 at time t431, so as to indicate the flash memory 320 that the erase address is to be inputted thereafter. The command decoder 325 decodes the erase address specification command 411, and controls the row decoder 324 to obtain the address to be inputted thereafter.

The controller 310 sends an erase address 412 to the flash memory 320 at time t432. The row decoder 324 obtains the inputted erase address, and selects a specified physical block 322 so that the data can be erased.

Next, the controller 310 sends an erase execute command 413 to the flash memory 320 at time t433.

In response to this, the command decoder 325 starts, at time t434, erasing the physical block 322 selected by the row decoder 324. At the same time, the command decoder 325 sends, to the controller 310, an erase busy 414 as the memory control signal indicating that erasure is ongoing. A period defined as the erase busy 414 indicates that no data shall be allowed to be newly read out, written, or erased during such period, as in the case of writing.

Next, after the erase operation on the physical block 322 is finished at time t435, the command decoder 325 releases the erase busy 414 of the memory control signal.

Then, the MPU 311 of the controller 310 updates the address conversion table 313 and erase block table 314. FIG. 4(b) is a schematic diagram showing the state changed from the state shown in FIG. 4(a) by updating the data in logical address 0.

More specifically, since physical block 322 to which the writing was performed this time is in address 0, the MPU 311 updates the data in address 0 in the erase block table 314 to "0" indicating that the block has already been written. Moreover, as shown in FIG. 4(b), the MPU 311 also updates the value of address 0 in the address conversion table 313 to "0000" that indicates the physical address of the physical block 322 to which the writing has performed this time. Furthermore, since the physical block 322 which was erased this time is in address 1, the MPU 311 updates the data in address 1 in the erase block table 314 to "1" indicating that the block has already been erased, as shown in FIG. 4(b).

Data in the memory card 300 is updated by the host apparatus 200, as in the above-described manner.

Note that in FIGS. 5 and 6, although time widths are represented differently from the actual times for simplification purposes, it actually takes a few ms until an erase busy 414 and a write busy 407 end (e.g. according to NH29W12811T data sheet of Hitachi Ltd., erase busy time is 1 ms and write busy time is 2.5 ms). Furthermore, it takes a few hundred $\mu$s to input write data 405 (e.g. a value calculated from the NH29W12811T datasheet is: cycle time 120 ns×2112 bytes=253.44 $\mu$s), which is extremely long compared with other command inputs and address inputs that require less than 1 $\mu$s.

In other words, time required for update is approximately equal to the total of erase busy 414, time required to input write data 405, and write busy 407.

As described above, when data is updated in the existing memory card 300, new data is written to an already erased physical block 322, and then a physical block 322 which has become old data due to such writing is erased. This is because, if new data were written to a physical block 322 that contains original data after such physical block 322 is erased, there would be the state in which the original data has already been erased and the new data has not yet been written, for example, when some abnormality occurred during data processing, which causes a possibility of data destruction from the viewpoint of the host apparatus.

However, when data is updated in the existing memory card 300, there is such a problem as the duplication of the same data from the standpoint of the host apparatus in which new data has already been written and a physical block 322 which became old data has not yet been erased, when some abnormality occurs in the stage where such new data has been written to an already erased physical block 322.

Furthermore, when data is updated in the existing memory card 300, there exists a period during which the next command cannot be inputted from the controller 310 to the flash memory 320 while erasure is ongoing. This causes time required for update to get longer.

Moreover, when the capacity of the memory card 300 becomes lager, the capacity of the address conversion table 313 and erase block table 3114 also becomes larger, which further leads to an increased capacity of the RAM of the controller 310 in which these tables are generated.

The present invention has been conceived in view of the above circumstances, and it is an object of the present invention to provide a nonvolatile storage device and a control method thereof capable of maintaining data consistency even when some abnormality occurs while data is being updated, as well as capable of shortening the time required for updating data.

DISCLOSURE OF INVENTION

In order to achieve the above object, the nonvolatile storage device according to the present invention is a nonvolatile storage device comprising: a nonvolatile storage unit having a plurality of physical blocks, each of which is made up of a plurality of pages for storing data; and a control unit operable to write, when updating the data stored in the storage unit, new data to an erased first physical block that is different from a second physical block in which old data is stored, wherein when updating the data stored in the storage unit, the control unit writes the new data to a page of the first physical block after erasing invalid data stored in said first physical block.

Accordingly, it becomes possible to maintain data consistency, even when some abnormality occurs while the operation of data rewiring is being performed.

Here, it is preferable that the storage unit includes: a specification unit operable to select and specify one of the pages or one of the plurality of physical blocks; and a page holding unit operable to hold, in advance, data to be written to said one of the pages, and when updating the data stored in the storage unit, the control unit (i) erases the invalid data stored in the first physical block specified by the specification unit, (ii) transfers, to the page holding unit, the new data, while said erasure is being executed, and (iii) writes the new data to said first physical block after the erasure is finished.

In this case, since it is possible to transfer, to the page holding unit, the new data to be written while the physical block is being erased, it becomes possible to update the data stored in the storage unit, consuming a shorter time required for transferring the write data.

Furthermore, the storage unit may include a plurality of storage areas, each of which has a management area and a data area, the management area may have an address conversion table and a valid block table which correspond to one of the storage areas which said management area belongs to, the address conversion table being used to make a conversion between a logical address and a physical address, and the valid block table indicating whether valid data is stored in the respective physical blocks, and the control unit may further include a table holding unit operable to hold the address conversion table and the valid block table.

Accordingly, it is not necessary for the table holding unit of the control unit to hold address conversion tables and valid block tables for all the storage areas, which requires the table holding unit to have only a small capacity.

Note that not only is it possible to embody the present invention as a nonvolatile storage device with the above configuration, but also as a nonvolatile memory and a control device thereof. Moreover, it is also possible to embody the present invention as a control method for a nonvolatile storage device that includes, as its steps, the characteristic units equipped to the nonvolatile storage device with the above configuration, and further as a program that causes a computer apparatus to execute these steps.

BEST MODE FOR CARRYING OUT THE INVENTION

The following describes an embodiment of the present invention with reference to the drawings.

Figure 7:
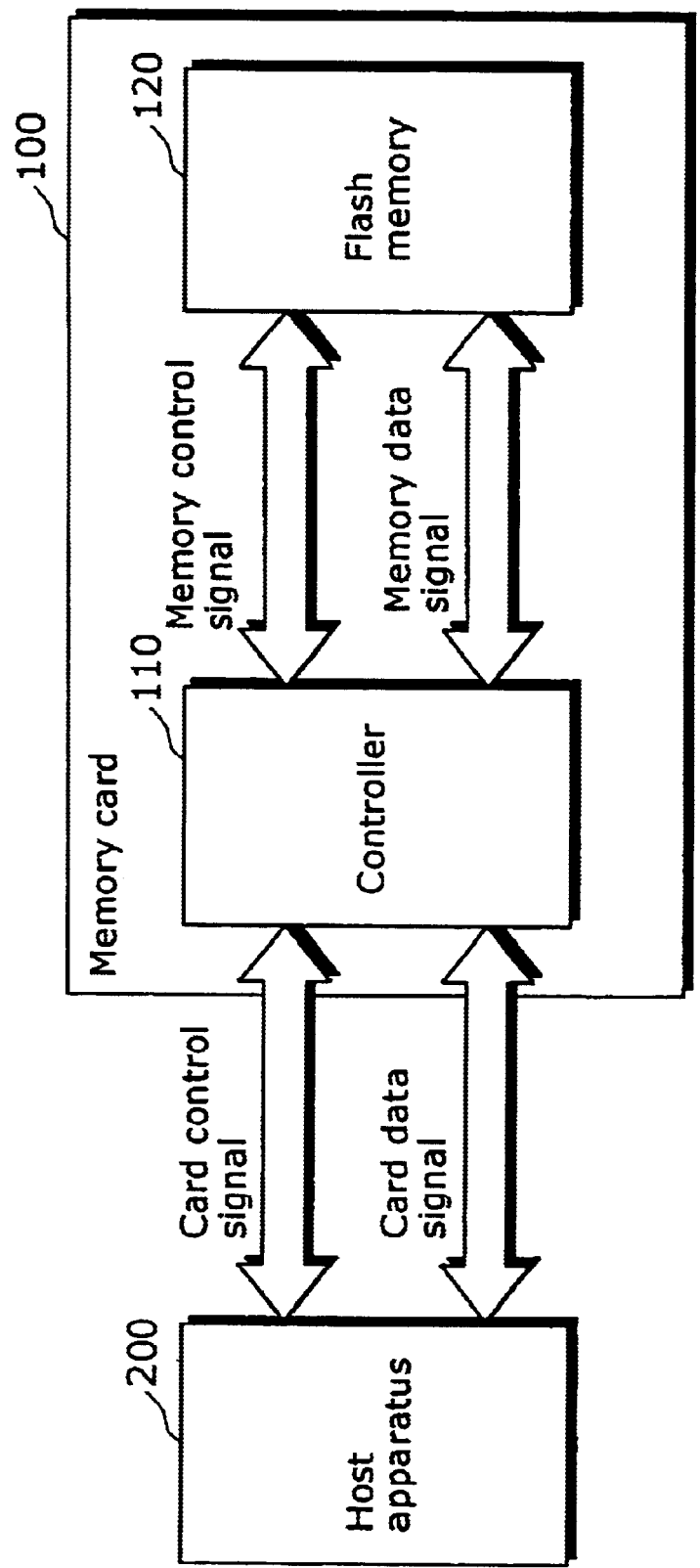
FIG. 7 is a block diagram showing a structure of a memory card that is an embodiment of the nonvolatile storage device according to the present invention.

FIG. 7 is a block diagram showing the structure of a memory card that is an embodiment of the nonvolatile storage device according to the present invention.

A memory card 100, which is a device for storing data, being connected to a host apparatus 200 such as a personal computer and a digital camera, includes a controller 110 and a flash memory 120. The host apparatus 200 writes and reads data to and from the memory card 100, by use of a card control signal and a card data signal. Such card control signal and card data signal are inputted/outputted between the host apparatus 200 and the controller 110 inside the memory card 100.

Regarding data writing and reading performed between the controller 110 and the flash memory 120, the controller 110 writes and reads data to and from the flash memory 120 by use of the memory control signal and memory data signal. Note that the flash memory 120 connected to the controller 110 does not have to be one chip, and therefore that plural chips may be connected to the controller 110.

Figure 8:
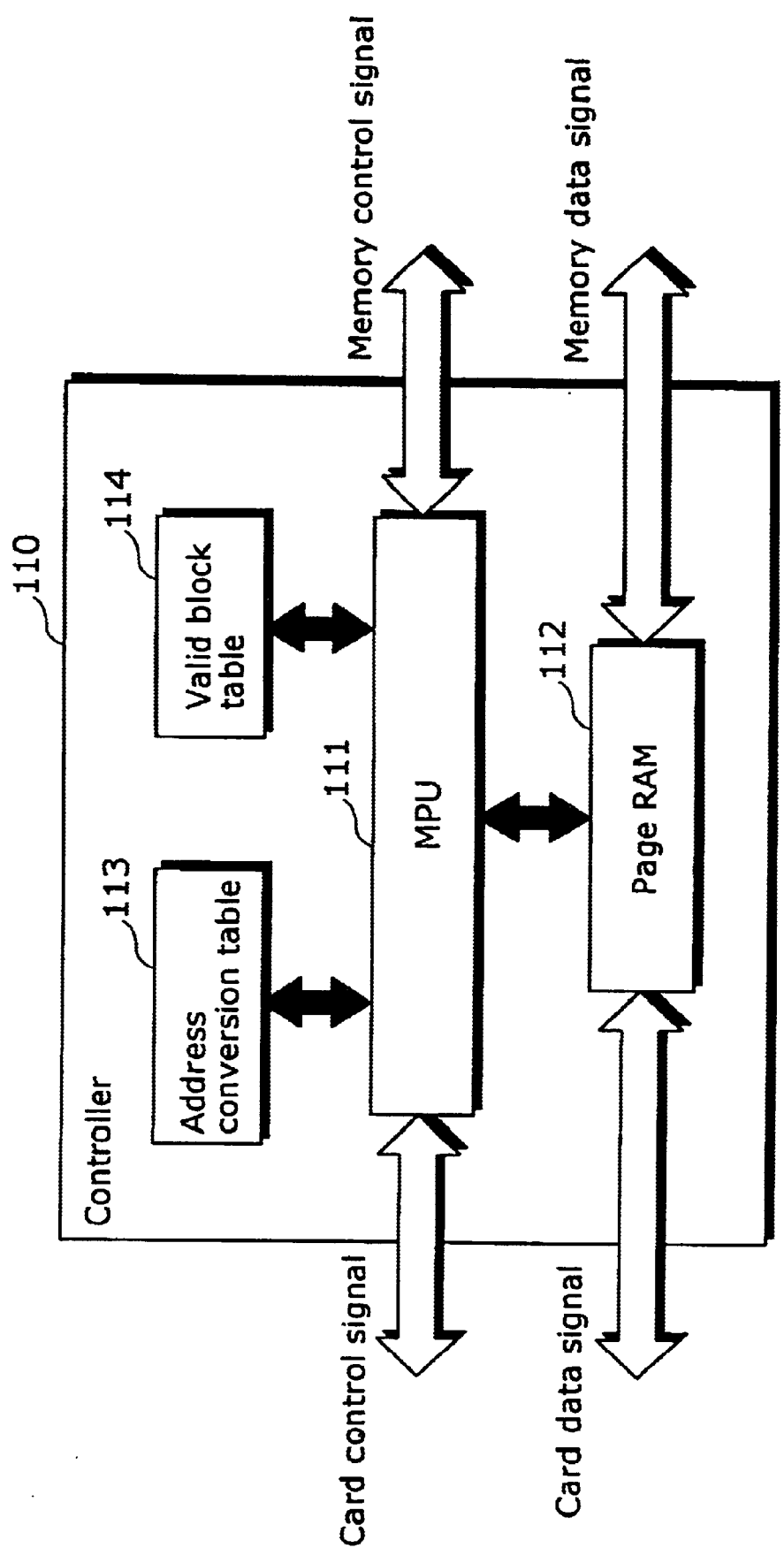
FIG. 8 is a block diagram showing a configuration of a controller according to the present embodiment.

FIG. 8 is a block diagram showing the configuration of the controller 110.

The controller 110 is comprised of an MPU 111, a page RAM 112, an address conversion table 113, and a valid block table 114.

The MPU 111 has an overall control over the controller 110, and also controls the data erasure from, data writing to, and data reading from the flash memory 120. The page RAM 112 is a volatile memory for temporarily storing data handled between the host apparatus 200 and the flash memory 120. The address conversion table 113 is a table for making a conversion between a host apparatus 200-specified address of data that is written to the flash memory 120 and a physical address in the flash memory 120. The valid block table 114 is a table that indicates whether data written on the flash memory 120 is valid or invalid on a physical address basis.

Here, "invalid physical block" means that valid data is not written to such block, and such physical block can either be in already written state or already erased state. Furthermore, information in the address conversion table 113 and the valid block table 114 is written in the management areas in the flash memory 120, and is read out by the MPU 111 from the flash memory 120 after the power is turned on or when necessary so as to be stored into the address conversion table 113 and the valid block table 114. Moreover, when the address conversion table 113 and the valid block table 114 are updated, the MPU 111 writes the updated data to the management areas in the flash memory 120, in response to such update.

Figure 9:
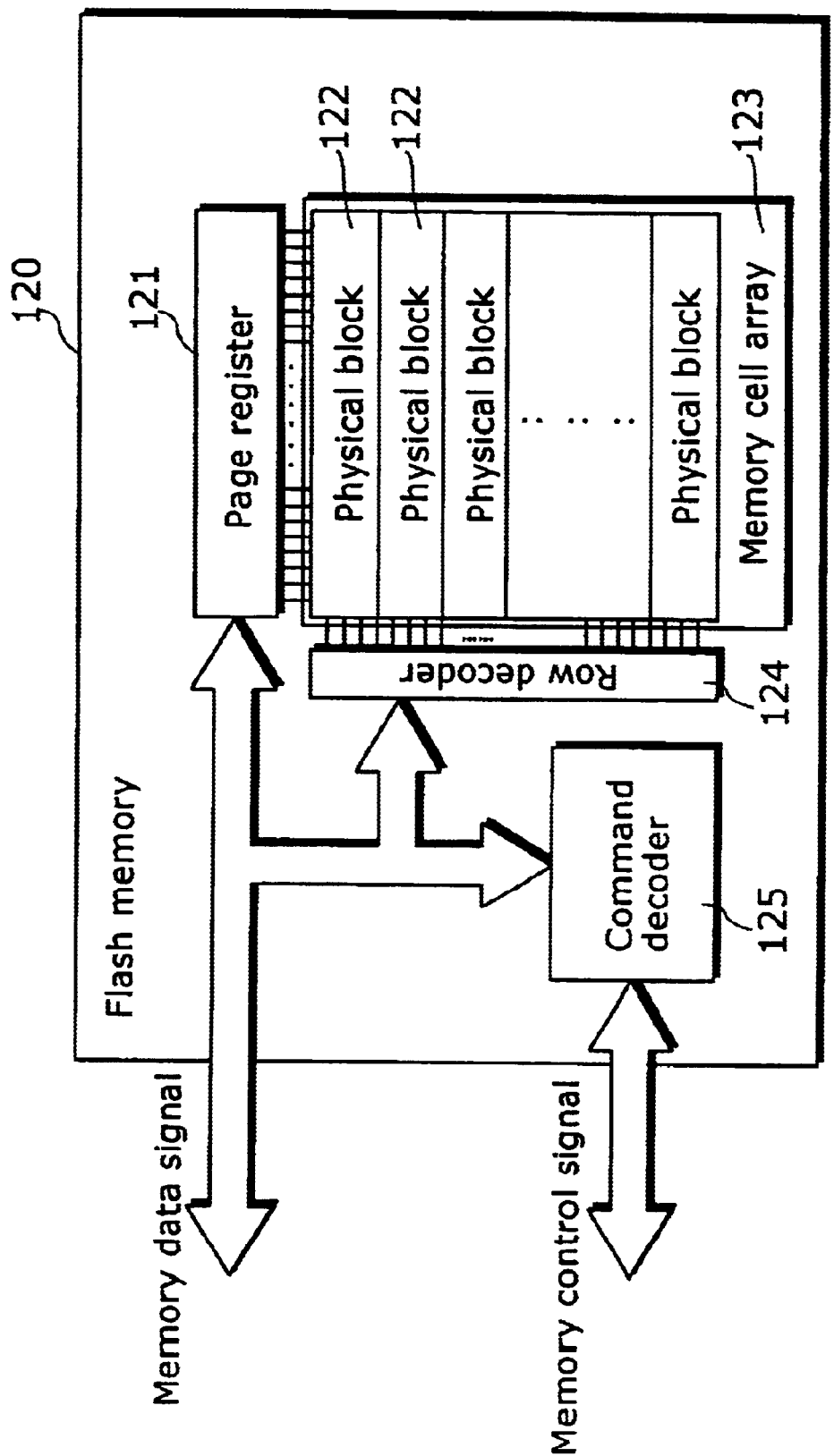
FIG. 9 is a block diagram showing a configuration of a flash memory according to the present embodiment.

FIG. 9 is a block diagram showing the configuration of the flash memory 120.

The flash memory 120 is comprised of a page register 121, a memory cell array 123, a row decoder 124, and a command decoder 125.

The memory cell array 123 is made up of all the memory cells contained in one chip of the flash memory 120. Memory cells constitute a page in units in which reading and writing can be carried out simultaneously. Furthermore, a plurality of pages make up a physical block 122 that is an erasure unit. The page register 121 has the capacity equivalent to pages of memory cells, and holds write data to be inputted from the controller 110 as well as read data to be read out from memory cells.

The row decoder 124 selects a page specified by the controller 110 at the time of data reading and writing, whereas it selects a physical block 122 specified by the controller 110 at the time of erasing data. The command decoder 125 executes a command from the controller 110 that is sent as a memory control signal. Furthermore, the command decoder 125 allows a command to be inputted from the controller 110 to the flash memory 120 even while data erasure is ongoing, and exercises a control so that the command decoder 125 can operate even when commands come in the order of "write data" and "write address".

Figure 10:
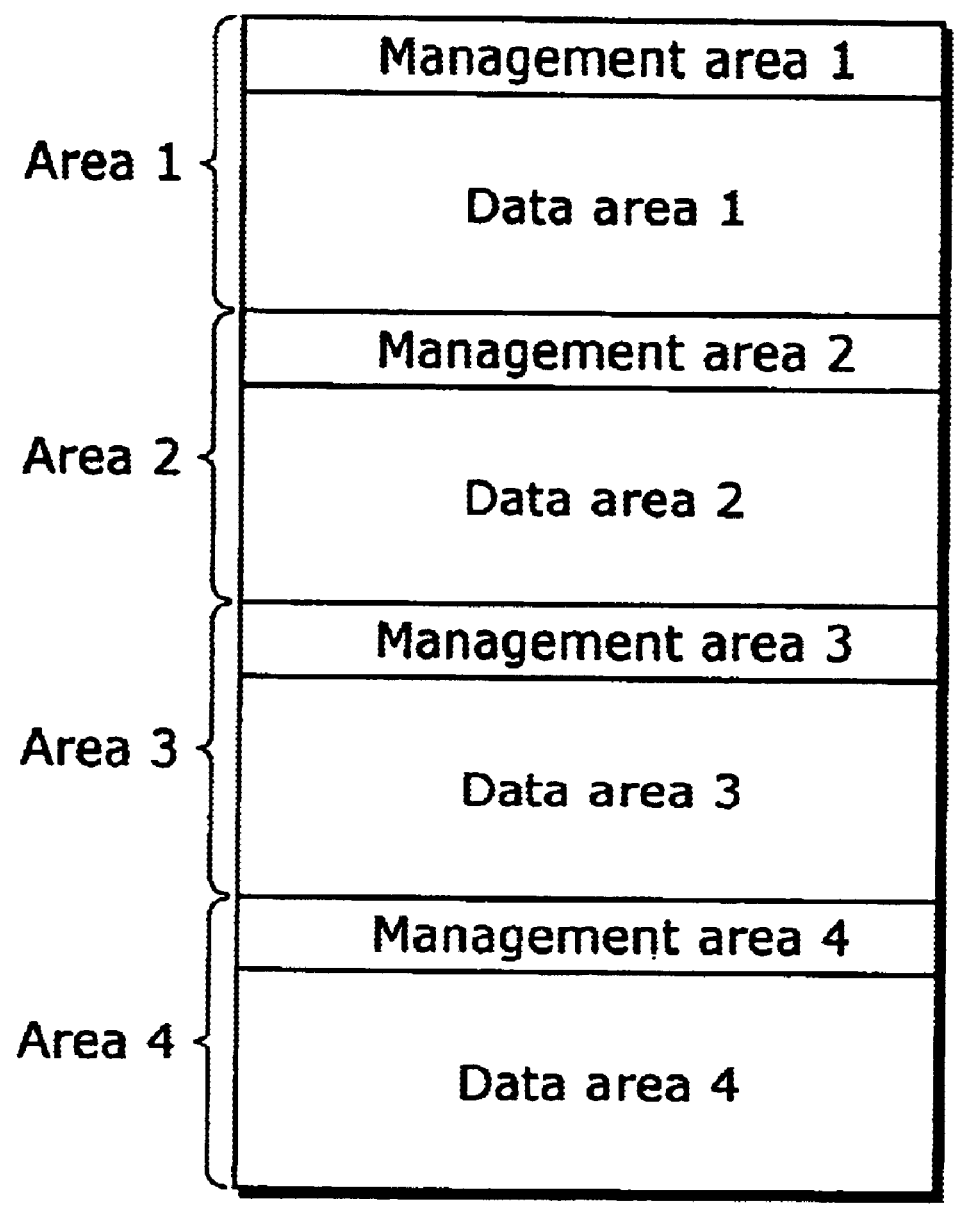
FIG. 10 is a schematic diagram showing an example logical configuration inside a memory cell array of the flash memory according to the present embodiment.

FIG. 10 is a diagram showing an example logical configuration inside the memory cell array 123 of the flash memory 120.

The memory cell array 123 is divided into plural areas in address order (four areas in an example shown in FIG. 10), and each of such areas has a management area and a data area. The address conversion table 113 and the valid block table 114 of the controller 110 are tables that describe information of one such area. Stated another way, an address conversation table 113 and a valid block table 114 corresponding to an area to which each management area belongs to is written in such management area.

Figure 11:
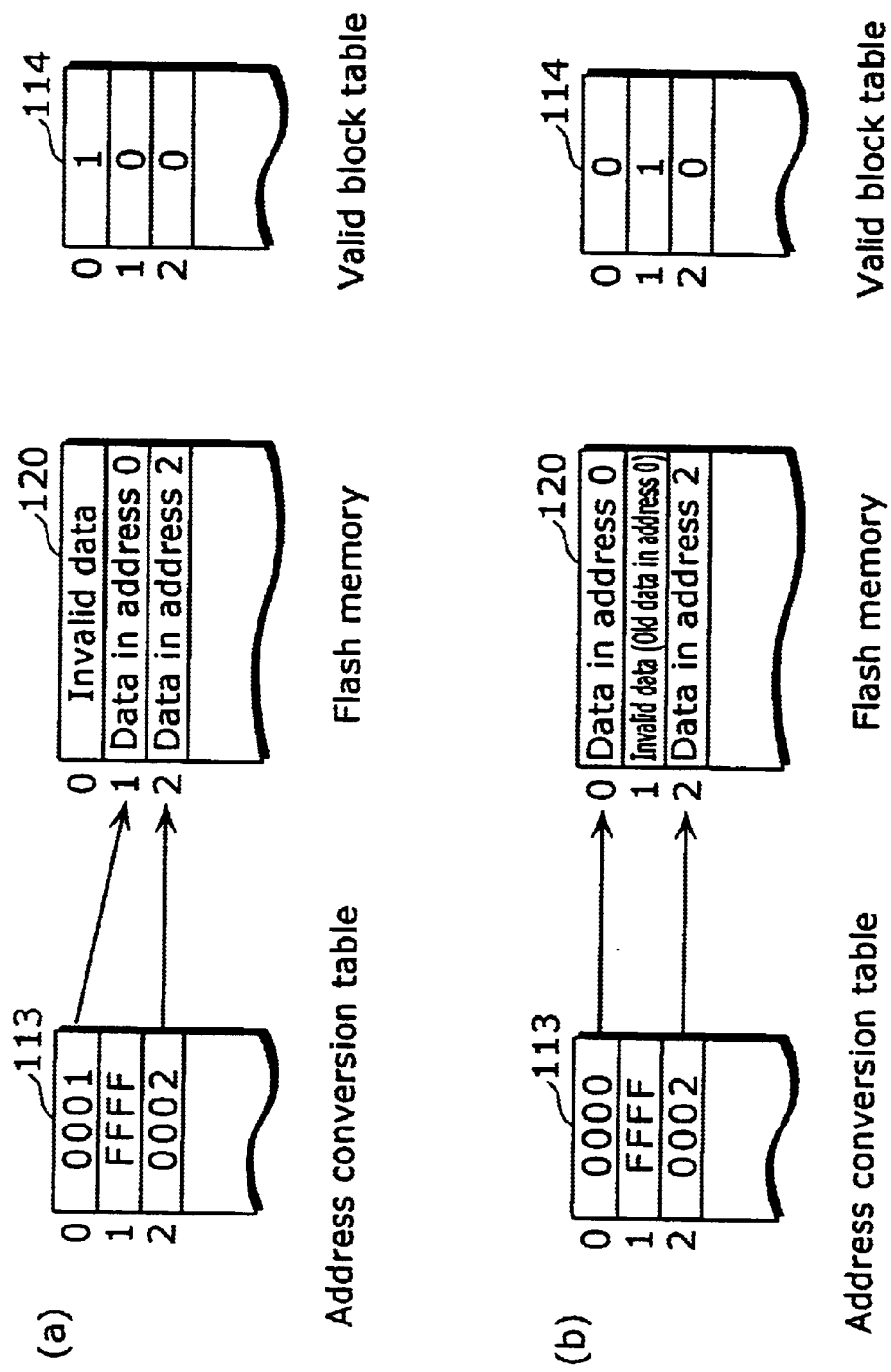
FIG. 11 is a schematic diagram showing example correspondence among data elements stored in an address conversion table, a valid block table, and the flash memory according to the present embodiment.

FIG. 11 is a schematic diagram showing example correspondence among data elements stored in the address conversion table 113, the valid block table 114, and the flash memory 120.

Data in address 0 described in the address conversion table 113 is a physical address that corresponds to logical address 0. Since such data is "0001" in an example illustrated in FIG. 11(a), it indicates that data in logical address 0 is written in physical address 1 in the flash memory 120. Meanwhile, "FFFF" indicating a physical address that corresponds to logical address 1 is an invalid value that means that there is no data in logical address 1. Here, "invalid value" is an arbitrary value that indicates invalidity and that is defined as invalid under the address conversion rule. An example of such value is a fixed value "0" and the maximum value "65535" in the case of 16-bit data. Furthermore, since data in address 2 in the address conversion table 113 is "0002", it indicates that data in logical address 2 is written in physical address 2 in the flash memory 120.

Meanwhile, the valid block table 114 shows the state of data written to the flash memory 120. The valid block table 114 holds, as address values, values that correspond to the respective physical addresses in the flash memory 120, and holds, as data values, whether data written to the respective physical addresses in the flash memory 120 is valid data or invalid data. For example, the valid block table 114 holds the value 0 when such data is valid, whereas it holds the value 1 when such data is invalid. Stated another way, data in address 0 in the valid block table 114 indicates whether data in physical address 0 in the flash memory 120 is valid or invalid. Since such data is "1" in an example illustrated in FIG. 11(a), it indicates that data in physical address 0 is invalid. Similarly, since each data in addresses 1 and 2 in the valid block table 114 is "0", it indicates that data in the respective physical addresses 1 and 2 in the flash memory 120 is valid.

Figure 1:
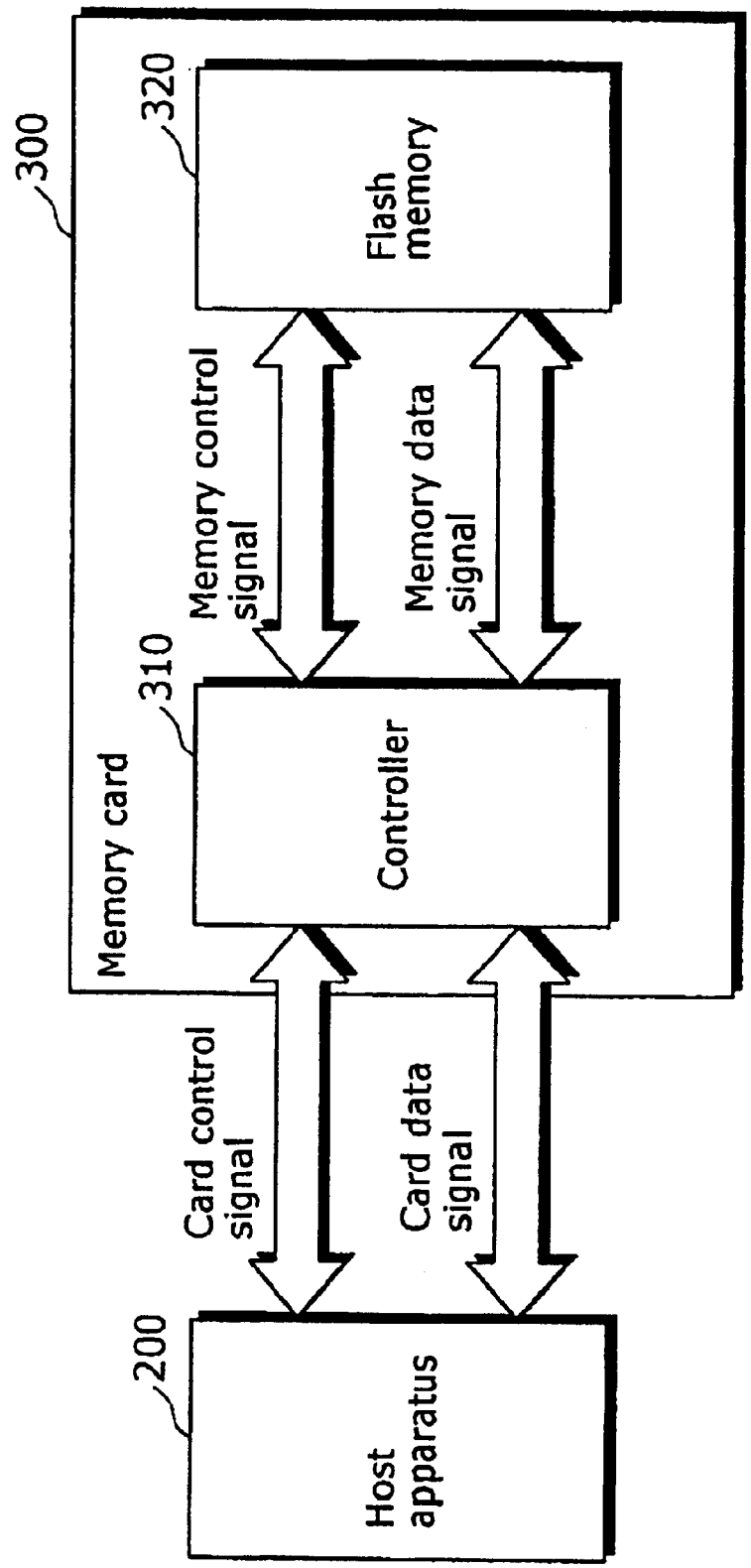
FIG. 1 is a block diagram showing a structure of a memory card that is an existing nonvolatile storage device.
Figure 2:
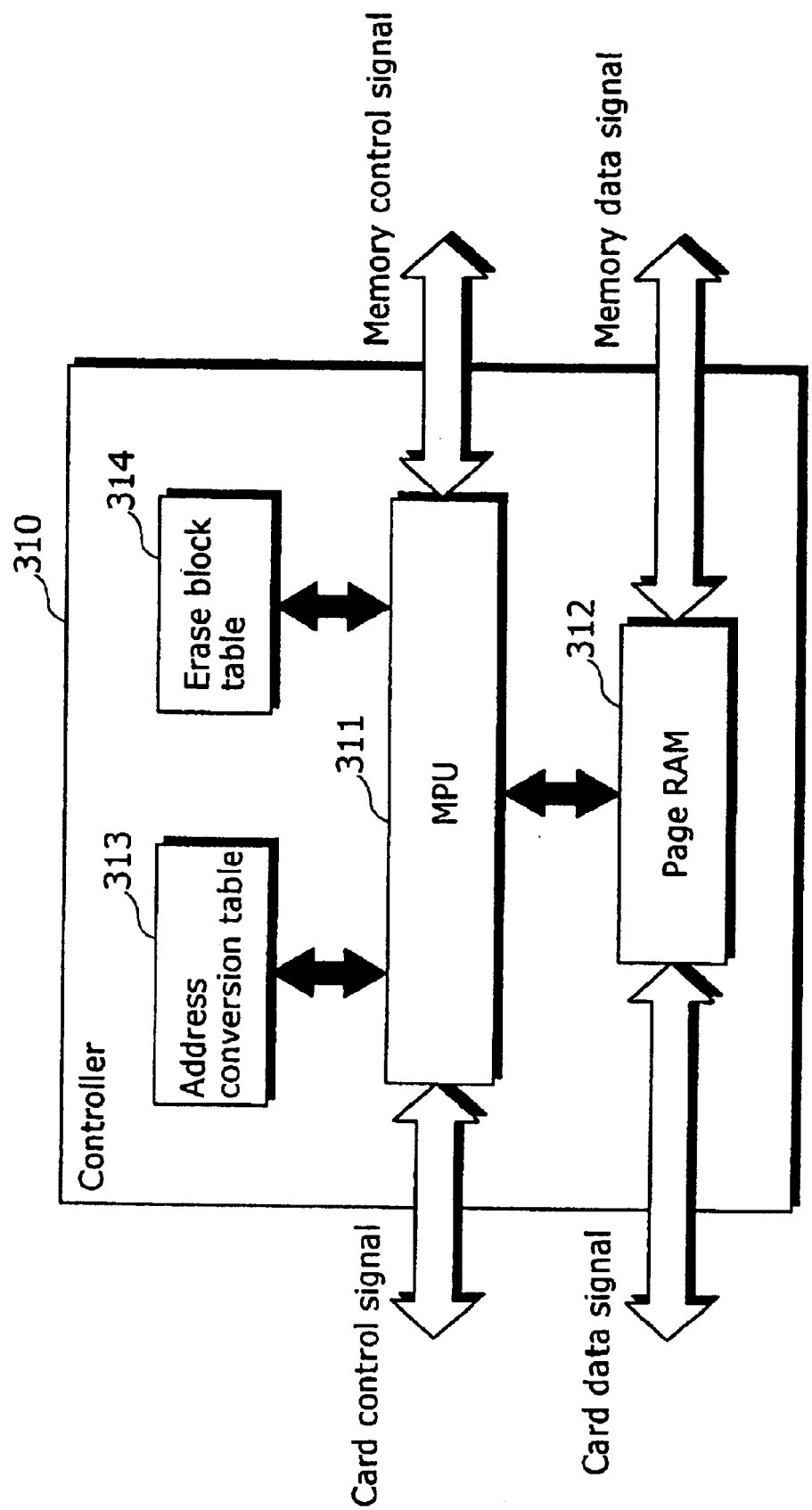
FIG. 2 is a block diagram showing a configuration of a controller of the existing memory card.
Figure 3:
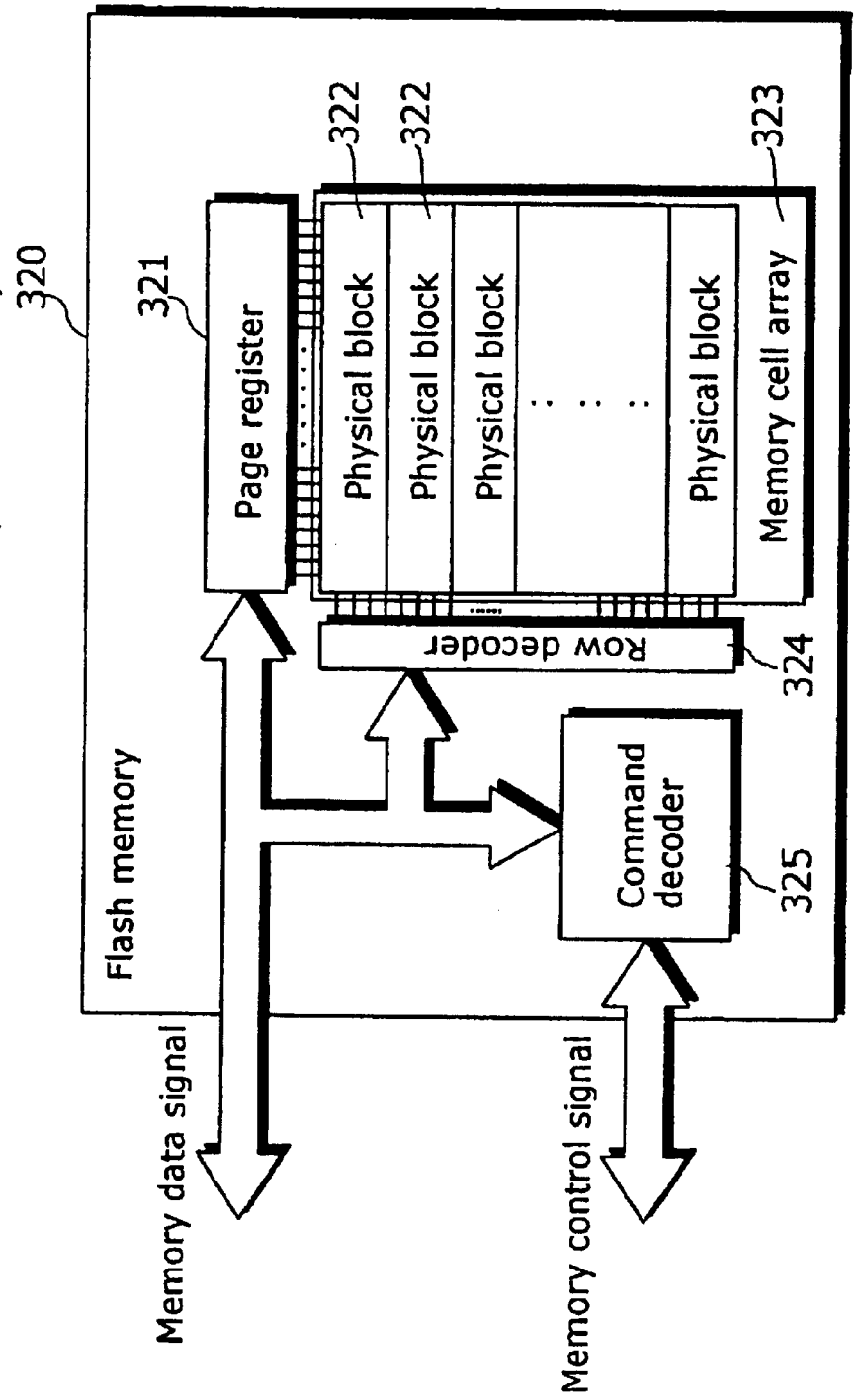
FIG. 3 is a block diagram showing a configuration of a flash memory of the existing memory card.
Figure 4:
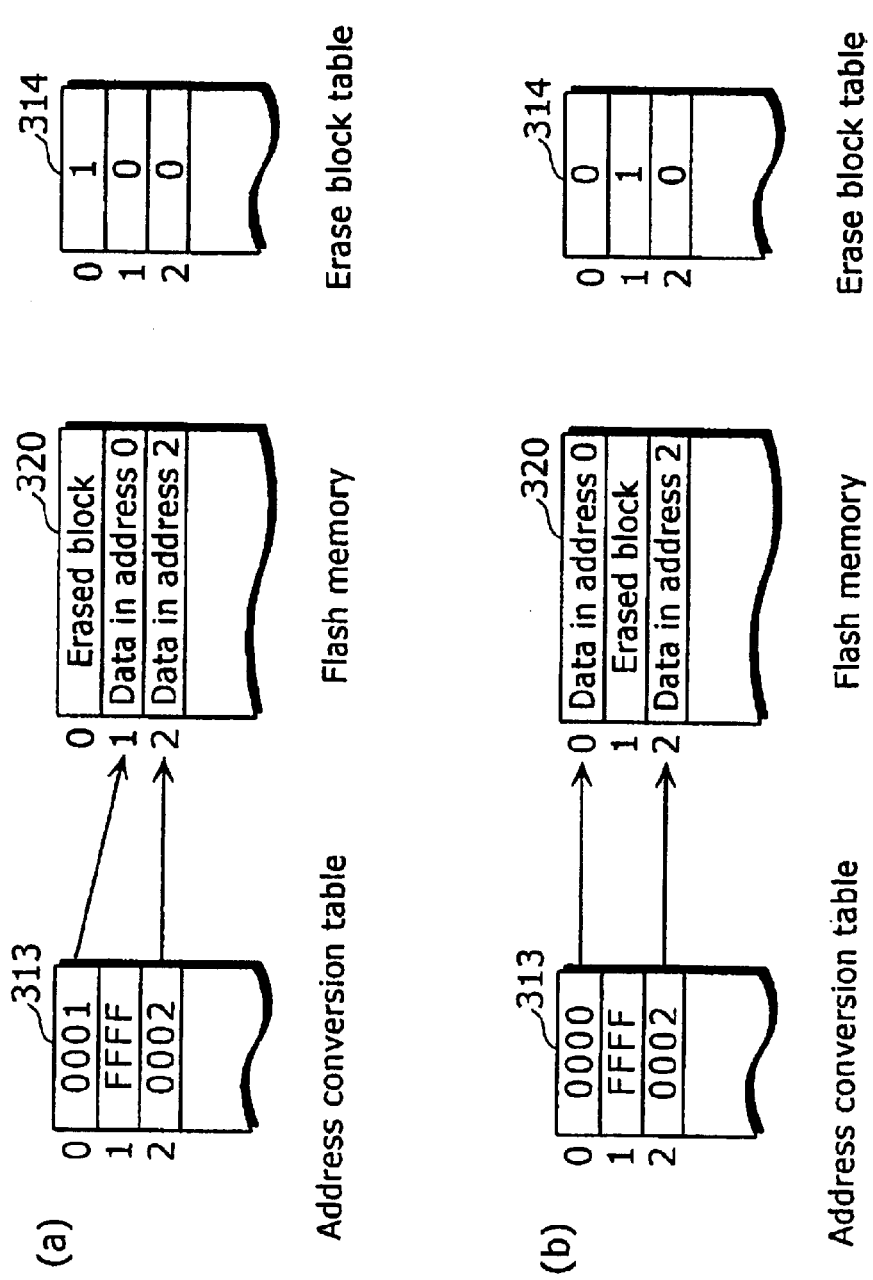
FIG. 4 is a schematic diagram showing example correspondence among data elements stored in an address conversion table, an erase block table, and the flash memory of the existing memory card.
Figure 5:
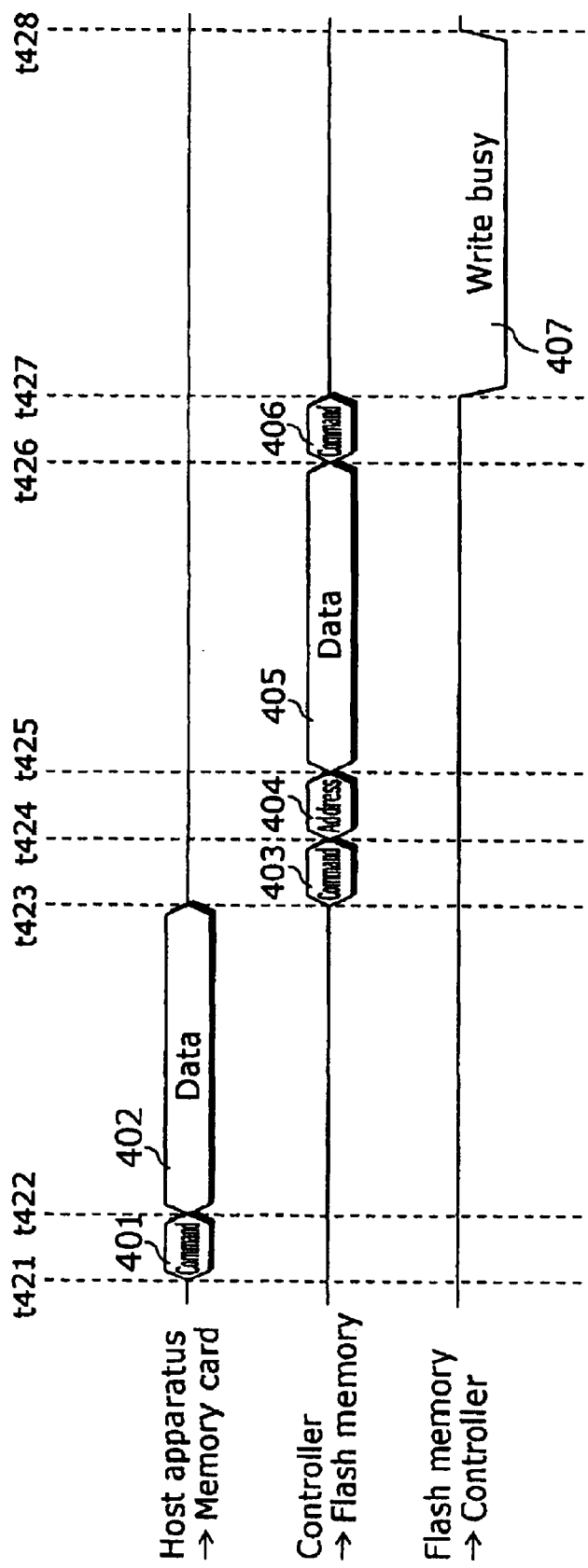
FIG. 5 is a timing chart showing a write operation to be performed when data is updated in the existing memory card.
Figure 6:
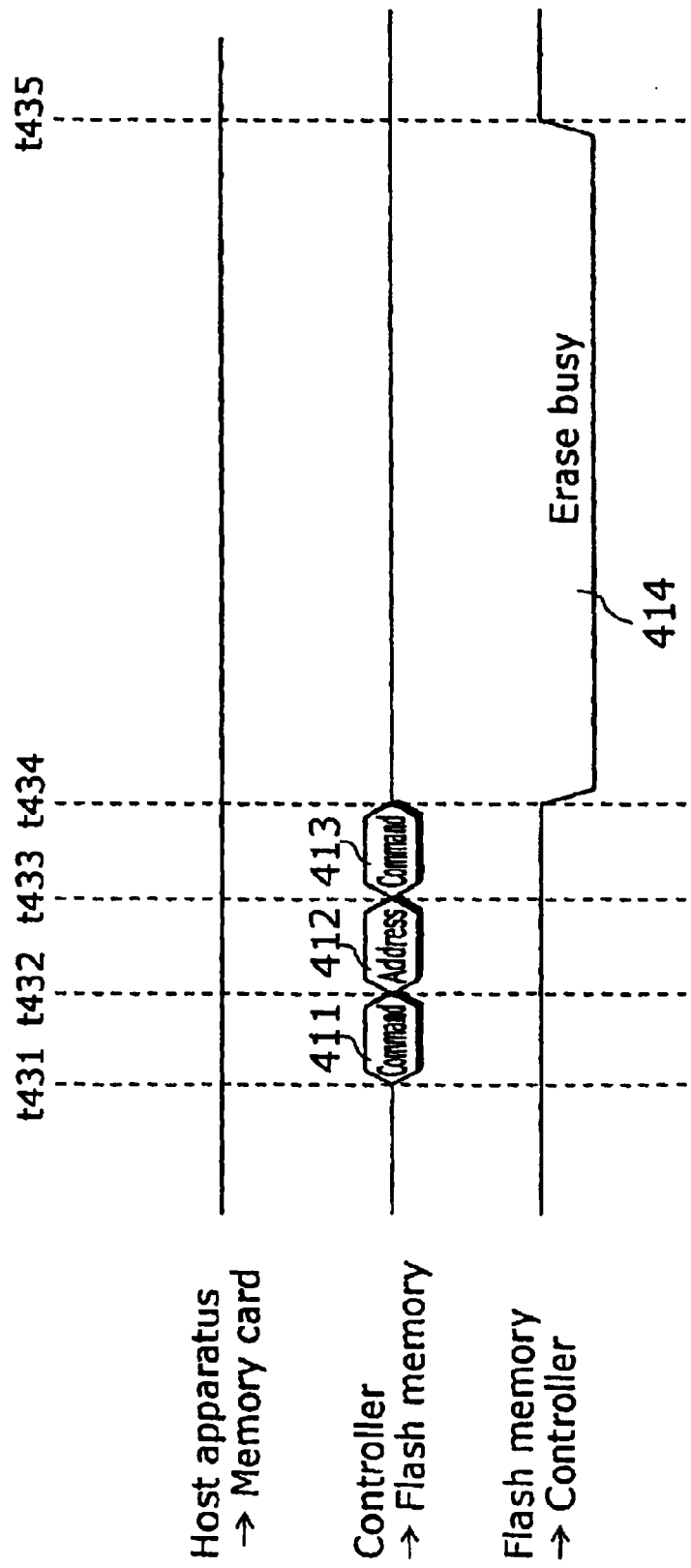
FIG. 6 is a timing chart showing an erase operation to be performed when data is updated in the existing memory card.
Figure 12:
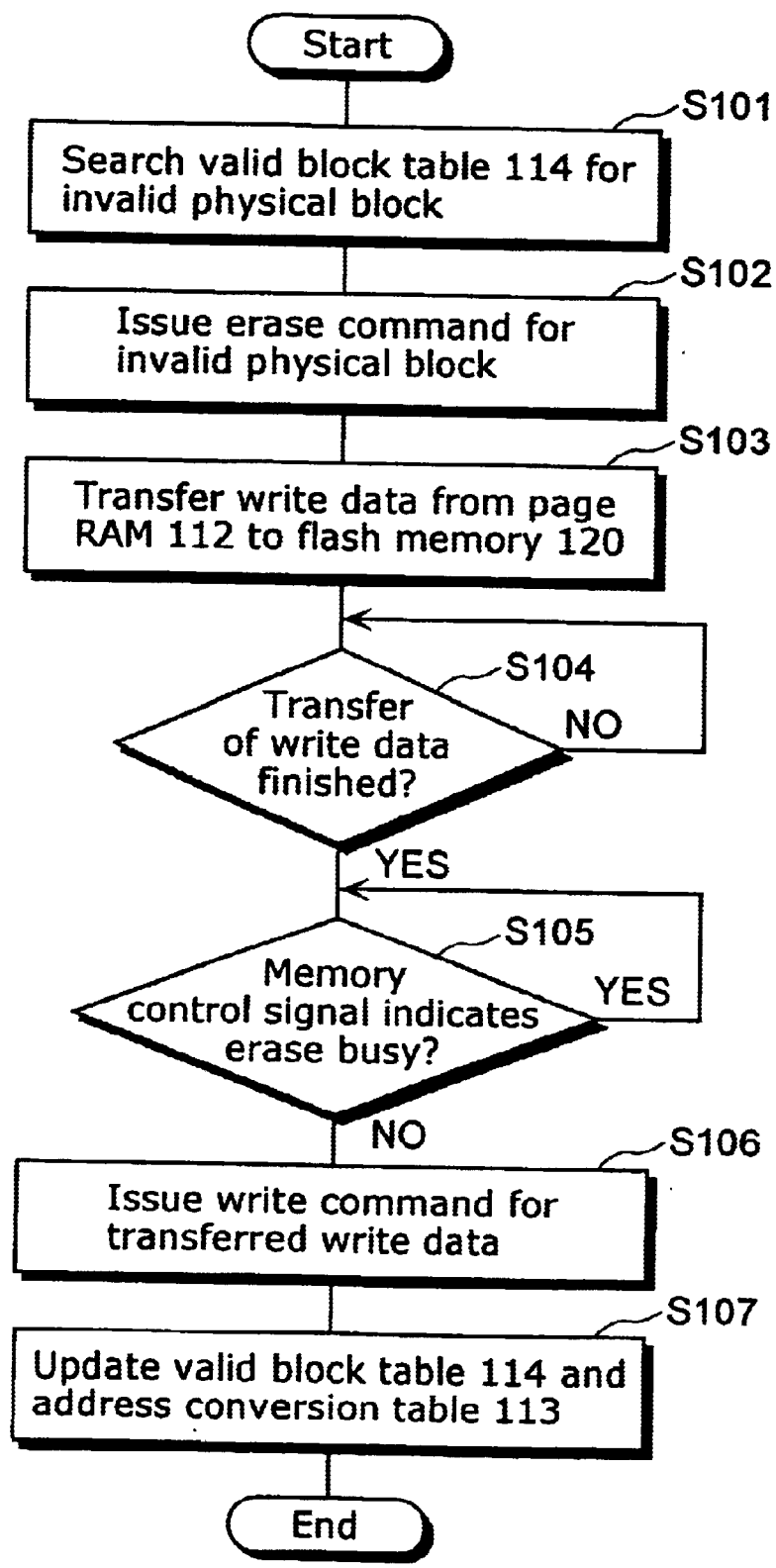
FIG. 12 is a flowchart showing an operation to be performed in the controller when data is updated in the memory card according to the present embodiment.
Figure 13:
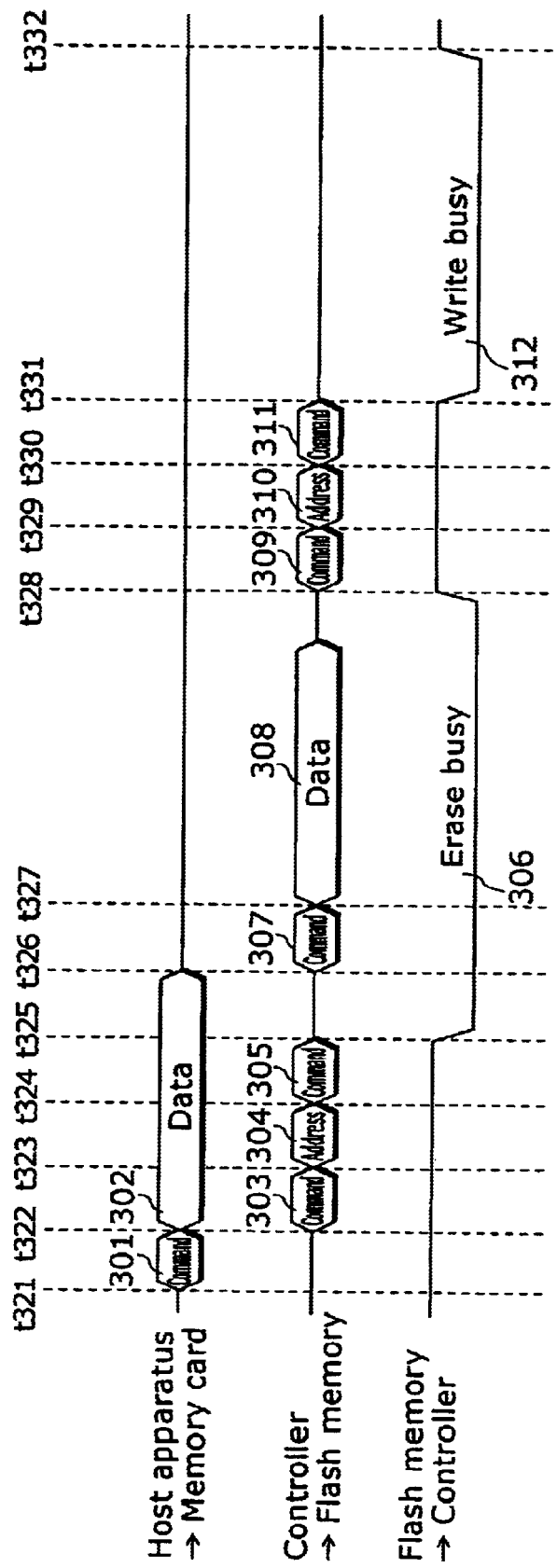
FIG. 13 is a timing chart showing an operation to be performed when data is updated in the memory card according to the present embodiment.

Next, a description is given of the operation to be performed when data in the memory card 100 with the above structure is updated by the host apparatus 200. FIG. 12 is a flowchart showing an operation to be performed in the controller 110 in such case, whereas FIG. 13 is a timing chart showing an operation to be performed in such case. In the timing chart shown in FIG. 13, upper signals are the card control signal and card data signal shown in FIG. 7, indicating that data is inputted from the host apparatus 200 to the memory card 100. Middle signals are the memory control signal and memory data signal shown in FIG. 3, indicating that data is inputted from the controller 110 to the flash memory 120. A lower signal is a memory control signal, indicating that data is outputted from the flash memory 120 to the controller 110. Here, a description is given for the case as an example where data in logical address 0 in the memory card 100 is updated, in the state shown in FIG. 11(a).

First, the host apparatus 200 sends, to the memory card 100, a write command 301 intended for logical address 0 as the card control signal at time t321, and starts transferring write data as the card data signal at time t322. Such write data is to be stored into the page RAM 112 of the controller 110 in the memory card 110.

Upon receipt of the write command 301 from the host apparatus 200, the controller 110 searches the valid block table 114 for a physical block storing invalid data to which it is possible to write the data (Step S101). Upon detecting in the valid block table 114 that physical address 0 is a physical block 122 storing invalid data, the controller 110 sends, to the flash memory 120, an erase address specification command 303 for the physical block 122 corresponding to physical address 0 at time t322. Such erase address specification command 303 indicates that the erase address is to be inputted thereafter. The command decoder 125 decodes the erase address specification command 303, and controls the row decoder 124 to make it obtain the address to be inputted thereafter.

Next, the controller 110 sends an erase address 304 to the flash memory 120 at time t323. The row decoder 124 obtains the inputted erase address, and selects a specified physical block 122 so that the data can be erased.

Then, the controller 110 sends an erase execute command 305 to the flash memory 120 at time t324 (Step S102).

In response to this, the command decoder 125 starts, at time t325, erasing the physical block 122 selected by the row decoder 124. At the same time, the command decoder 125 sends, to the controller 110, an erase busy 306 as the memory control signal indicating that erasure is ongoing. During the period defined as the erase busy 306, no data shall be allowed to be newly read out from, written to, or erased from a physical block 122 which are operations that require a selection by the row decoder 124, since the row decoder 124 needs to continuously select the physical block 122 subject to erasure.

After the data transfer from the host apparatus 200 is finished, the controller 310 sends a write data input command 307 to the flash memory 120 at time t326, regardless of whether or not the erase busy 306 is inputted from the flash memory 120 as the memory control signal, so as to indicate the flash memory 120 that write data is to be inputted thereafter. The command decoder 125 decodes the write data input command 307, and controls the page register 121 to make it obtain the write data to be inputted thereafter.

Next, the controller 110 starts transferring write data 308 from the page RAM 112 to the flash memory 120 at time 327t (Step S103). The command decoder 125 stores the inputted write data into the page register 121. The data transferred here is write data to be written to a page included in the physical block 122 that is being erased. Note that the flash memory 120 is performing erase operation here, but it is possible to store write data since the page register 121 is not in use.

After the erase operation performed on the physical block 122 is finished at time t328, the command decoder 125 releases the erase busy 306 of the memory control signal. From then on, It is possible for the row decoder 124 to select another physical block 122 or page.

After the transfer of the write data from the page RAM 112 to the flash memory 120 is finished and the erase busy 306 from the flash memory 120 is released (Steps S104 and S105), the controller 110 sends a write address specification command 309 for the data transferred to the page register 121 at time t328, so as to indicate the flash memory 120 that a write address is to be inputted thereafter. The command decoder 125 decodes the write address specification command 309, and controls the row decoder 124 to obtain the address to be inputted thereafter.

The controller 110 sends a write address 310 to the flash memory 120 at time t329. The row decoder 124 obtains the inputted write address, and selects a specified page so that the data can be written to it. The page to be specified here is a page included in the physical block on which the erase operation has finished above.

Then, the controller 110 sends a write execute command 311 to the flash memory 120 at time t330 (Step 5106).

In response to this, the command decoder 125 starts, at time t331, writing the data stored in the page register 121 to memory cells in the page selected by the row decoder 124. At the same time, the command decoder 125 sends, to the controller 110, a write busy 312 as the memory control signal indicating that writing is ongoing. During a period defined as the write busy 312, the row decoder 124 keeps selecting a page to which data is to be written, and therefore no data shall be allowed to be newly read out from, written to, or erased from a physical block 122, which are operations that require a selection by the row decoder 124, as in the case of the period of the erase busy 306.

After the write operation to the page is finished at time t332, the command decoder 125 releases the write busy 312 of the memory control signal.

After this, the controller 110 writes the data transferred from the host apparatus 200, to the other pages of the physical block 122 which has been erased in the above-described manner.

Then, the MPU 111 of the controller 110 updates the address conversion table 113 and valid block table 114 (Step S107). FIG. 11(b) is a schematic diagram showing the state changed from the state shown in FIG. 11(a) by updating the data in logical address 0.

More specifically, since the data corresponding to logical address 0 which was updated this time is "0001", as shown in FIG. 11(a), the MPU 111 updates the data in the corresponding address 1 in the valid block table 114 to "1", as shown in FIG. 11(b), indicating invalid data. Moreover, the MPU 111 also updates the value of address 0 in the address conversion table 113 to "0000", as shown in FIG. 11(b), that indicates the physical address of the physical block 122 to which the writing has performed this time. Then, the MPU 111 updates the data in address 0 in the valid block table 114 to "0" indicating valid data, as shown in FIG. 11(b).

Finally, the MPU 111 writes the address conversation table 113 and valid block table 114 which have been updated in the above manner, to the management areas in the flash memory 120 in updated form.

Data in the memory card 100 is updated by the host apparatus 200 side, as in the above-described manner. Note that when this writing is carried out, the updated old data of logical address 0 exits in the flash memory 120 as invalid data, and will not be erased until writing is performed to the physical block 122 that stores such old data, at the time of updating another data.

As described above, when data is updated in the memory card 100, a physical block 122 storing invalid data is erased first, and then new data is written to such physical block 122 which has been erased. This makes it possible to transfer write data 308 from the page RAM 112 to the page register 121 in the flash memory 120 even during the period of the erase busy 306. Accordingly, it becomes possible to update the flash memory 120, consuming a shorter time required for transferring write data.

Moreover, it is also possible to maintain consistency between data even if some abnormality occurs while the operation for updating data is taking place.

Furthermore, since the memory cell array 123 is logically divided into plural areas, and an address conversion table 113 and a valid block table 141 corresponding to each of such areas are written to the management area of each of the areas, the RAM of the controller 110 that reads in these tables is required to have only a small capacity.

Note that in the present embodiment, the controller 110 sends, to the flash memory 120, the write data input command 307 after the data transfer from the host apparatus 200 is finished, but the present invention is not limited to this. Therefore, the controller 110 may send the write data input command 307 after the erase execute command 305 is sent and before the data transfer from the host apparatus 200 is finished, for example. In this case, the controller 110 transfers the write data 308 from the page RAM 112 to the flash memory 120 after the data transfer from the host apparatus 200 is finished.

Moreover, in the present embodiment, a description is given for a method in which the command decoder 125 exercises such a control as enables the flash memory 120 to operate even if commands are inputted in order of "write data" and "write address", but the present invention is not limited to this. It is therefore possible to input commands in order of "write address" and "write data" by newly incorporating an address register to the flash memory 120, where a write address to be inputted during the period of the erase busy 306 is to be stored, and then by moving such write address to the row decoder 124 from the address register before the writing is executed.

As described above, according to the nonvolatile storage device of the present invention, it is possible to maintain consistency between data even if some abnormality occurs during the operation for updating data is taking place, since, when data stored in a storage unit is updated, data stored in an invalid physical block that is different from a physical block in which old data is stored, is erased first and then new data is written to a page in the erased physical block.

Furthermore, it is also possible to shorten the time required for updating data, by transferring, to the storage unit, data to be written next, in line with the erasure of a physical block. This leads to an improved usability of the nonvolatile storage device, as well as to a further improved user convenience.

As is obvious from the above, the present invention, which is capable of improving the usability of a nonvolatile storage device, is extremely useful in the present age when there is a widespread use of portable devices utilizing nonvolatile storage devices.

Industrial Applicability

As described above, the nonvolatile storage device according to the present invention is suited for use as a storage device that stores data of a portable device, such as a digital camera and a mobile phone, that handles audio data and video data.

What is claimed is:

1. A nonvolatile storage device comprising:
a nonvolatile storage unit having a plurality of physical blocks, each of which is made up of a plurality of pages for storing data; and
a control unit operable to write, when updating the data stored in the storage unit, new data to an erased first physical block that is different from a second physical block in which old data is stored,
wherein when updating the data stored in the storage unit, the control unit writes the new data to a page of the first physical block after erasing invalid data stored in said first physical block.

2. The nonvolatile storage device according to claim 1, wherein the storage unit includes:
a specification unit operable to select and specify one of the pages or one of the plurality of physical blocks; and
a page holding unit operable to hold, in advance, data to be written to said one of the pages,
wherein when updating the data stored in the storage unit, the control unit (i) erases the invalid data stored in the first physical block specified by the specification unit, (ii) transfers, to the page holding unit, the new data, while said erasure is being executed, and (iii) writes the new data to said first physical block after the erasure is finished.

3. The nonvolatile storage device according to claim 2, wherein when writing the new data, the control unit transfers, to the specification unit, an address for specifying the page to which the new data is to be written, after transferring said new data to the page holding unit, and writes the new data to said one of the pages selected by the specification unit.

4. The nonvolatile storage device according to claim 1, wherein the storage unit includes a plurality of storage areas, each of which has a management area and a data area,
the management area has an address conversion table and a valid block table which correspond to one of the storage areas which said management area belongs to, the address conversion table being used to make a conversion between a logical address and a physical address, and the valid block table indicating whether valid data is stored in the respective physical blocks, and
the control unit further includes a table holding unit operable to hold the address conversion table and the valid block table.

5. The nonvolatile storage device according to claim 4, wherein the control unit (i) reads out, from the storage unit, the address conversion table and valid block table corresponding to each of the storage areas when necessary, so as to have the table holding unit hold said readout tables,
(ii) specifies the first physical block in which the invalid data is stored with reference to the valid block table when updating the data stored in the storage unit, (iii) updates the address conversion table and the valid block table when said update of the data is finished, so as to reflect said update of the data on these tables, and (iv) writes the updated address conversion table and valid block table to the corresponding management area.

6. A nonvolatile memory, comprising:
- a plurality of physical blocks, each of which is made up of a plurality of nonvolatile pages for storing data;
- a specification unit operable to select and specify one of the pages or one of the physical blocks; and
- a page holding unit operable to hold, in advance, data to be written to said one of the pages,
- wherein the data to be written to said page is transferred to the page holding unit while said one of the physical blocks specified by the specification unit is being erased.

7. A control device for controlling a nonvolatile memory that includes a plurality of physical blocks, each of which is made up of a plurality of nonvolatile pages for storing data, the control device comprising a control unit operable to write, when updating the data stored in the nonvolatile memory, new data to an erased first physical block that is different from a second physical block in which old data is stored,
- wherein when updating the data stored in the nonvolatile memory, the control unit writes the new data to a page of the first physical block after erasing invalid data stored in said first physical block.

8. The control device according to claim 7, further comprising a table holding unit operable to hold an address conversion table and a valid block table, the address conversion table being used to make a conversion between a logical address and a physical address, and the valid block table indicating whether valid data is stored in the respective physical blocks,
- wherein the control unit specifies the first physical block in which the invalid data is stored with reference to the valid block table, when updating the data stored in the nonvolatile memory, and updates the address conversion table and the valid block table when said update of the data is finished, so as to reflect said update of the data on these tables.

9. A control method for controlling a nonvolatile storage device, the control method comprising a control step of writing new data to an erased first physical block that is different from a second physical block in which old data is stored, when data stored in a nonvolatile storage unit having a plurality of physical blocks is updated, each of said physical blocks being made up of a plurality of pages for storing data,
- wherein in the control step, when the data is updated, the new data is written to a page of the first physical block, after invalid data stored in said first physical block is erased.

10. The control method for controlling the nonvolatile storage device according to claim 9, further comprising a table holding step of holding an address conversion table and a valid block table, the address conversion table being used to make a conversion between a logical address and a physical address, and the valid block table indicating whether valid data is stored in the respective physical blocks,
- wherein the control step includes:
- a specification step of specifying the first physical block in which the invalid data is stored with reference to the valid block table, when the data stored in the storage unit is updated; and
- an update step of updating the address conversion table and the valid block table when said update of the data is finished, so as to reflect said update of the data on these tables.

11. A program for updating data stored in a nonvolatile memory that includes a plurality of physical blocks, each of which is made up of a plurality of nonvolatile pages for storing data, the program causing a computer to execute a control step of writing new data to an erased first physical block that is different from a second physical block in which old data is stored,
- wherein in the control step, when the data is updated, the new data is written to a page of the first physical block, after invalid data stored in said first physical block is erased.

* * * * *